US010389007B1

(12) United States Patent
Choi et al.

(10) Patent No.: US 10,389,007 B1
(45) Date of Patent: Aug. 20, 2019

(54) MOBILE TERMINAL

(71) Applicant: LG ELECTRONICS INC., Seoul (KR)

(72) Inventors: Dongjun Choi, Seoul (KR); Joseph Lee, Seoul (KR); Hangseok Kim, Seoul (KR); Minchul Shin, Seoul (KR); Youngwook Sohn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/116,800

(22) Filed: Aug. 29, 2018

(30) Foreign Application Priority Data

Jun. 11, 2018 (KR) .................... 10-2018-0066714

(51) Int. Cl.
*H04M 1/00* (2006.01)
*H01Q 1/02* (2006.01)
(Continued)

(52) U.S. Cl.
CPC ............... *H01Q 1/02* (2013.01); *H01Q 1/243* (2013.01); *H04B 1/3833* (2013.01);
(Continued)

(58) Field of Classification Search
CPC ........ H01Q 1/02; H01Q 1/243; H04B 1/3833; H04B 2001/3894; H04M 1/0264; H04M 1/0277; H04M 1/18
(Continued)

(56) References Cited

U.S. PATENT DOCUMENTS 9,270,458 B2 * 2/2016 Shibutani ............... H04L 9/0894
9,473,604 B2 * 10/2016 Choi ................... H04M 1/0266
(Continued)

FOREIGN PATENT DOCUMENTS

CN  107768822  3/2018
KR  1020140031358  3/2014
(Continued)

OTHER PUBLICATIONS

PCT International Application No. PCT/KR2018/009468, Written Opinion of the International Searching Authority dated Feb. 28, 2019, 11 pages.
(Continued)

*Primary Examiner* — Marceau Milord
(74) *Attorney, Agent, or Firm* — Lee, Hong, Degerman, Kang & Waimey PC

(57) ABSTRACT

There is disclosed a mobile terminal comprising a terminal body comprising a terminal body comprising a plurality of cases forming an external appearance of the mobile terminal; a waterproof member configured to prevent liquid from entering the mobile terminal between at least two of the plurality of cases; an air vent hole configured to allow air to pass between an interior and an exterior of the mobile terminal; a waterproof mesh disposed at the air vent hole and configured to allow air but not liquid to pass through the air vent hole; an antenna module provided in the plurality of cases and comprising an antenna radiator and a wireless integrated circuit; and a heat radiation unit having a first end adjacent to the antenna module and a second end adjacent to the air vent hole to allow heat from the antenna module to escape via the air vent hole.

12 Claims, 10 Drawing Sheets

(51) Int. Cl.
    *H04B 1/3827*     (2015.01)
    *H04M 1/18*     (2006.01)
    *H04M 1/02*     (2006.01)
    *H01Q 1/24*     (2006.01)
    *H04B 1/38*     (2015.01)

(52) U.S. Cl.
    CPC ....... *H04M 1/0264* (2013.01); *H04M 1/0277* (2013.01); *H04M 1/18* (2013.01); *H04B 2001/3894* (2013.01)

(58) Field of Classification Search
    USPC ................ 455/575.7, 550.1, 575.1, 566
    See application file for complete search history.

(56) References Cited

U.S. PATENT DOCUMENTS

| | | | |
|---|---|---|---|
| 9,629,268 B2 * | 4/2017 | Lee | H05K 5/0247 |
| 9,680,206 B2 * | 6/2017 | Youn | H04M 1/0249 |
| 9,720,458 B2 * | 8/2017 | Kang | G06F 1/182 |
| 10,097,227 B2 * | 10/2018 | Kang | G06F 1/182 |
| 2007/0139288 A1 * | 6/2007 | Shigemoto | H01Q 1/3241 |
| | | | 343/788 |
| 2008/0088600 A1 * | 4/2008 | Prest | G06F 3/03547 |
| | | | 345/173 |
| 2008/0207283 A1 * | 8/2008 | Zaitsu | H04M 1/026 |
| | | | 455/575.3 |
| 2012/0242588 A1 * | 9/2012 | Myers | G06F 1/1637 |
| | | | 345/173 |
| 2012/0327581 A1 * | 12/2012 | Pais | G06F 1/1632 |
| | | | 361/679.26 |
| 2013/0225065 A1 | 8/2013 | Lee | |
| 2014/0164976 A1 * | 6/2014 | Kim | G06F 1/1643 |
| | | | 715/773 |
| 2014/0285711 A1 | 9/2014 | Umehara | |
| 2015/0155614 A1 * | 6/2015 | Youn | H04M 1/0249 |
| | | | 343/702 |
| 2015/0201065 A1 * | 7/2015 | Shim | H04M 1/72569 |
| | | | 455/556.1 |
| 2015/0280322 A1 * | 10/2015 | Saito | H01Q 7/06 |
| | | | 343/788 |
| 2015/0334859 A1 * | 11/2015 | Lee | H05K 5/0247 |
| | | | 361/749 |
| 2016/0016362 A1 * | 1/2016 | Kim | B23Q 15/00 |
| | | | 700/98 |
| 2016/0226570 A1 * | 8/2016 | Nicholls | H01Q 1/246 |
| 2016/0248893 A1 | 8/2016 | Kim | |
| 2016/0372837 A1 * | 12/2016 | Jung | H04B 5/0031 |
| 2017/0005393 A1 * | 1/2017 | Wu | H01Q 1/243 |
| 2017/0086317 A1 | 3/2017 | Pelletier et al. | |
| 2017/0097715 A1 * | 4/2017 | Kim | H04M 1/0266 |
| 2017/0201011 A1 * | 7/2017 | Khripkov | H01Q 1/243 |
| 2017/0230073 A1 | 8/2017 | Youn et al. | |
| 2017/0294932 A1 * | 10/2017 | Kang | G06F 1/182 |
| 2018/0115054 A1 * | 4/2018 | Wu | H01Q 5/35 |
| 2018/0211150 A1 * | 7/2018 | Orihara | G06K 19/077 |
| 2018/0278284 A1 * | 9/2018 | Cha | H04B 1/38 |

FOREIGN PATENT DOCUMENTS

| | | |
|---|---|---|
| KR | 1020140049348 | 4/2014 |
| KR | 1020150049292 | 5/2015 |
| KR | 1020150064566 | 6/2015 |
| KR | 1020180014603 | 2/2018 |

OTHER PUBLICATIONS

European Patent Office Application Serial No. 18195768.9, Search Report dated Mar. 25, 2019, 9 pages.

* cited by examiner (a)

(b)

(a)

(b)

(a)

(b)

MOBILE TERMINAL

CROSS-REFERENCE TO RELATED APPLICATIONS

Pursuant to 35 U.S.C. § 119(a), this application claims the benefit of earlier filing date and right of priority to Korean Patent Application No. 10-2018-0066714, filed on Jun. 11, 2018, the contents of which are hereby incorporated by reference herein in its entirety.

BACKGROUND OF THE DISCLOSURE

Field of the Disclosure

Embodiments of the present disclosure relate to a mobile terminal including an antenna which may be used in 5th generation mobile communication.

Background of the Disclosure

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

With such the diversified and expanded functions of the mobile terminal, diverse wireless communication methods are applied to the mobile terminal to facilitate exchange of data wirelessly. The mobile terminal having the diversified functions facilitates the appreciation of UHD image quality files or the use of virtual reality contents via a mobile communication network. Accordingly, there are increasing demands for a technique configured to transceive more data more rapidly.

As a result, there was the advent LTE (Long Term Evolution, $4^{th}$ generation communication) communication for transceiving mass data rapidly and such LTE communication has advanced into new techniques having 2× faster transfer speeds such as LTE-A and integrated LTE or the like. To enhance the transfer speeds, two or more frequency bands are used or the frequency bandwidth is increased so as to increase the data transmission amount. The number of the antennas is increased to increase the frequency bandwidth or use signals in different frequency bands at the same time.

There is a limit to the increase of bandwidths or the use of signals in two or more bands. Accordingly, 5th generation mobile communication technique has emerged. The 5G mobile communication is advantageous in transceiving mass data and has a fast responding speed, compared with the conventional 4G mobile communication. The 5G mobile communication uses a higher frequency band signal than the 4G mobile communication such that it may requires a totally different type of an antenna.

SUMMARY OF THE DISCLOSURE

Accordingly, an object of the present invention is to address the above-noted and other problems and provide a mobile terminal which includes a structure for radiate the heat generated in an antenna for transceiving a signal which will be used in $5^{th}$ generation mobile communication.

Embodiments of the present disclosure may provide a mobile terminal comprising a terminal body comprising a plurality of cases forming an external appearance of the mobile terminal; a waterproof member configured to prevent liquid from entering the mobile terminal between at least two of the plurality of cases; an air vent hole configured to allow air to pass between an interior and an exterior of the mobile terminal; a waterproof mesh disposed at the air vent hole and configured to allow air but not liquid to pass through the air vent hole; an antenna module provided in the plurality of cases and comprising an antenna radiator and a wireless integrated circuit; and a heat radiation unit having a first end adjacent to the antenna module and a second end adjacent to the air vent hole to allow heat from the antenna module to escape via the air vent hole.

The heat radiation unit comprises a plurality of heat radiation holes disposed adjacent to the air vent hole.

The heat radiation unit comprises copper or aluminum.

The plurality of cases comprises a side case disposed at a lateral side of the mobile terminal and comprising a metal area and a non-metal area; and the antenna module is disposed adjacent to the non-metal area of the side case.

The plurality of cases further comprises a rear case; and the waterproof member is disposed between the rear case and the side case; and the air vent hole extends between an interior of the mobile terminal to a region outside the waterproof member, wherein a first opening of the air vent hole is covered by the rear case.

The side case further comprises a partition wall formed with a connecting hole therethrough, wherein the antenna module is disposed at an outer side of the partition wall adjacent to the connecting hole; and the heat radiation unit comprises a thermal interface material (TIM) member disposed at the connecting hole and configured to contact the antenna module; and a heat radiation sheet having a first end in contact with the thermal interface material member and a second end adjacent to a second opening of the air vent hole.

The mobile terminal may further comprise a heat diffusion sheet disposed between the non-metal area and the antenna module.

The mobile terminal may further comprise an antenna bracket coupled to a side case of the plurality of cases and configured to accommodate the antenna module.

The antenna module comprises an antenna board comprising a plurality of layers; a wireless integrated circuit disposed at the antenna board; and an antenna radiator configured to radiate a signal.

The antenna module is disposed such that a first side of the antenna board faces toward the interior of the mobile terminal and a second side of the antenna board opposite the first side faces toward the exterior of the mobile terminal.

The mobile terminal may further comprise a camera comprising a lens disposed at a rear side of the terminal body and a camera frame disposed around the lens and forming a portion of the exterior appearance the mobile terminal, wherein the antenna module is disposed adjacent to the camera, wherein the air vent hole is an opening formed at the camera frame, and a rear case of the plurality of cases covers a portion of the camera frame and is configured to cover the air vent hole.

The antenna radiator comprises a plurality of antenna radiators aligned at preset intervals of 1 cm or less.

According to the embodiment of the present disclosure, the mobile terminal has following effects. The mobile terminal in accordance with the present disclosure may efficiently radiate the heat, which is generated in an antenna module for 5G wireless communication, under a waterproof structure.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DESCRIPTION OF SPECIFIC EMBODIMENTS

Figure 1A:
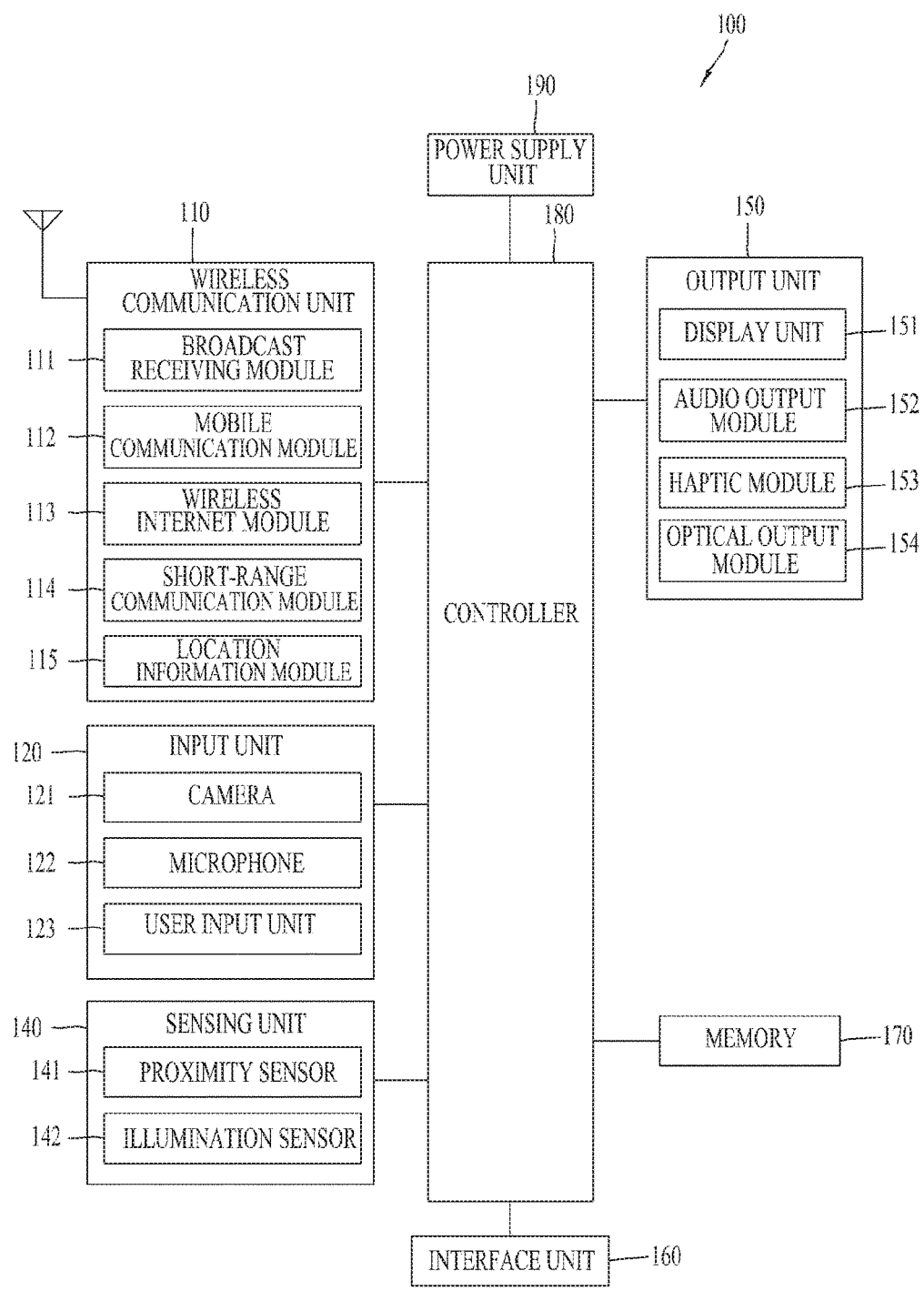
FIG. 1A is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

The terminology used in the present disclosure is used only to describe specific embodiments, not intended to limit the present disclosure. A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
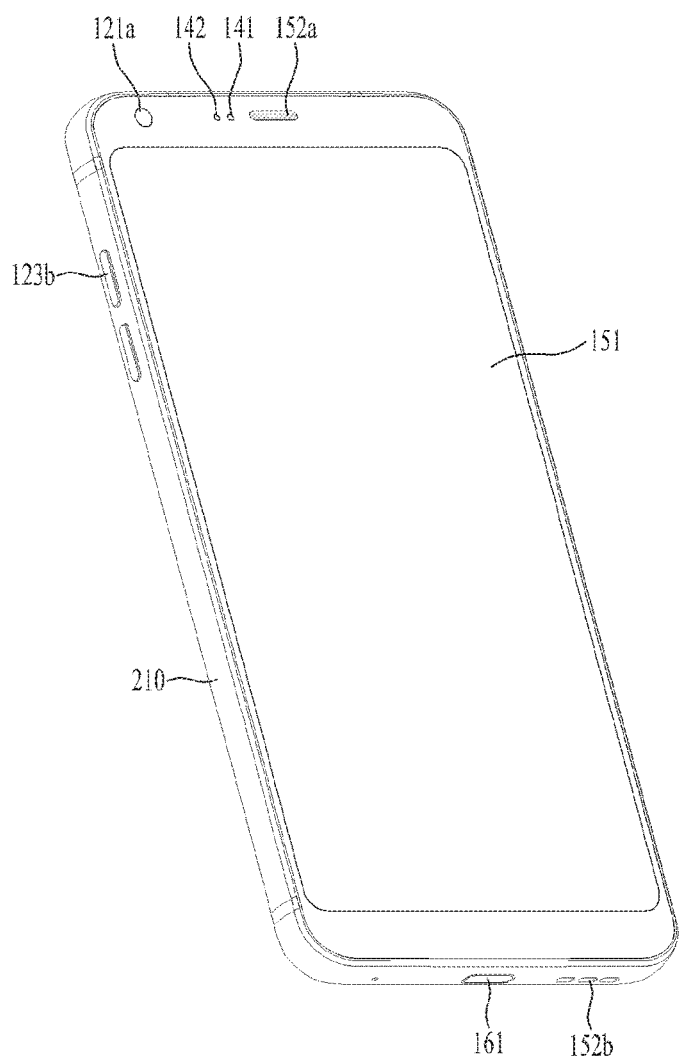
FIGS. 1B and 1C are conceptual views of one example of the mobile terminal, viewed from different directions.
Figure 1C:
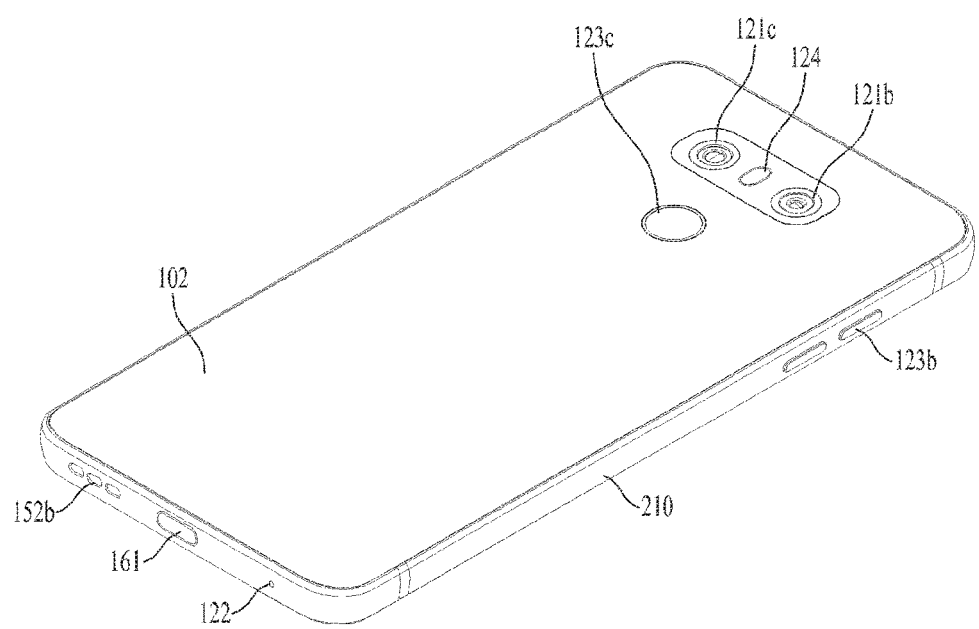

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in The FIG. 1A is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Hereinafter, referring to FIG. 1, the components mentioned above will be described in detail before describing the various embodiments which are realized by the mobile terminal 100 in accordance with the present disclosure.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal.

As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like).

In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 may be provided with the power supplied by an external power source and the power supplied therein under the control of the controller 180 so as to supply the needed power to each of the components. The power supply unit 190 may include a battery. The battery may be a built-in type which is rechargeable and detachably loaded in the terminal to be charged.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

As shown in the drawing, there is a recent advent of a mobile terminal including a window 151a which is disposed on a front surface of the display unit may cover the overall front area, while including no front case. Such a mobile terminal may include a side case 210 formed to cover a lateral side. The window 151a, the side case 210 and the rear case 102 may form an inner space. As occasion occurs, some electronic components may be loaded even in the rear case 102. The electronic components which can be loaded in the rear case 102 may include a removable battery, an identity module, a memory card and the like. In this instance, a rear cover for covering the loaded electronic components may be detachably coupled to the rear case 102. Accordingly, when the rear cover is decoupled from the rear case 102, the electronic components loaded in the rear case 102 will be exposed outside.

Synthetic resin or metal is injected in a mold to fabricate such the cases 102 and 210 and examples of the metal include stainless steel (STS), aluminum (Al) and the like.

The side case 210 in accordance with the embodiments of the present disclosure may include metal and it may be used as an antenna radiator. Such the metal useable as the antenna radiator has to be a conductive material having a preset length which is proper to characteristics of a frequency for a transceived signal, accordingly, a middle area of the side case 210 made of the metal is partitioned off by a slit 220 to form a plurality of conductive members and a non-metallic material is filled in the slits 220 to use the conductive members as the antenna radiator.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the audio output module, the proximity sensor 141, the illuminance sensor 142, the optical output module 154, the camera 121, the user input unit 123, the microphone 122 and the interface unit 160.

It will be described for the mobile terminal as shown in FIGS. 1B and 1C. The display unit 151, the first audio output module 151a, the proximity sensor 141, an illumination sensor 142, the optical output module 154, the first camera 121a and the first manipulation unit 123a are arranged in front surface of the terminal body, the second manipulation unit 123b, the microphone 122 and interface unit 160 are arranged in side surface of the terminal body, and the second audio output modules 151b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown located adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A) may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Further preferred embodiments will be described in more detail with reference to additional drawing figures. It is understood by those skilled in the arm that the present features can be embodied in several forms without departing from the characteristics thereof.

As the multimedia function becomes important, the wireless communication technique may be performed in the mobile terminal 100 in various methods. For example, the wireless communication is performed in a short or long range or between devices. At this time, the frequency bands used in this instance are different and different antennas have to be used.

LTE which is one of the 4$^{th}$ generation mobile communications has emerged to support the transceiving of mass data. However, considering a trend of a wireless network user's data consumption and wide availability of Io T (Internet of Things), there are demands for new ultra-broadband mobile communication technique for transceiving mass data faster than LTE. 5$^{th}$ generation mobile terminal communication techniques are under development and RF techniques for 5$^{th}$ generation (5G) mobile communication is referred to as 'NR (New Radio)' in 3GPP (3$^{rd}$ Generation Partnership Project) and 'IMT (International Mobile Telecommunication)-2020' in ITU (International Telecommunications Union), which is a communication method realized in a different way from conventional LTE.

Such 5G mobile communication facilitates fast transmission of mass data and improvement of data transmission reliability. With wide-spreading of Io T (Internet of Things), the 5G mobile communication may further include a function of Io T communication supporting.

5G is a mobile communication technique of which the maximum download and the minimum download speed are 20 Gps and 100 Mbps. Also, 5G may provide 1,000,000 devices within a 1 km$^2$ with the IoT service and facilitate free communication even in a high-speed train at the speed of 500 km/h. The download speed of 5G is 280 times faster than that of the conventional LTE, which allows a user to download a 1 GB movie in 10 seconds.

The 5G mobile communication has a remarkably improved response speed, as well as the transmission speed. When the data transmission speed shows how much data passes at once, the response speed shows how long it takes for little data to go.

The response speed of 4G becomes as fast even as 10-50 ms (millisecond, one thousandth second). The response speed of 5G becomes about 10 times faster than that of 4G. Accordingly, 5G is expected to be introduced in such fields as self-driving cars and IoT which have to transceive mass data with a central sever constantly.

5G may use frequency bands of centimeter waves (3 GHz-30 GHz) and millimeter waves (30 GHz~300 GHz). The present disclosure will suggest the embodiments which use the millimeter waves. As the millimeter wave has a wavelength of 10 mm or less and then use a small radiator. When the wavelength is relatively short, the speed of the electromagnetic wave becomes fast and a millimeter wave signal is interfered by an obstacle. Accordingly, the radiation direction of the signal can be adjusted by using an array antenna, which is called 'beam forming'.

Figure 2:
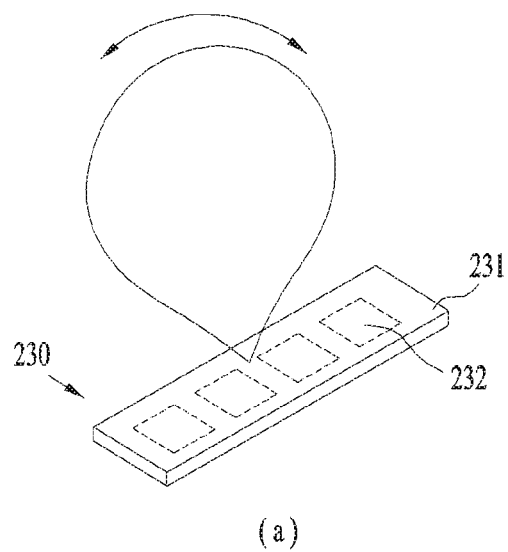
FIGS. 2 and 3 are conceptual views of an antenna module in accordance with the present disclosure.
Figure 2:
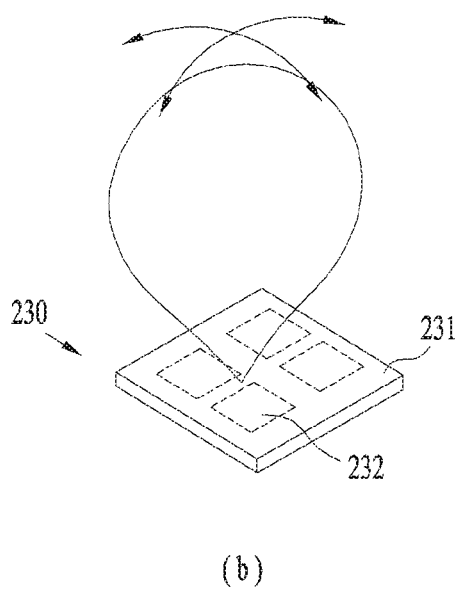
Figure 3:
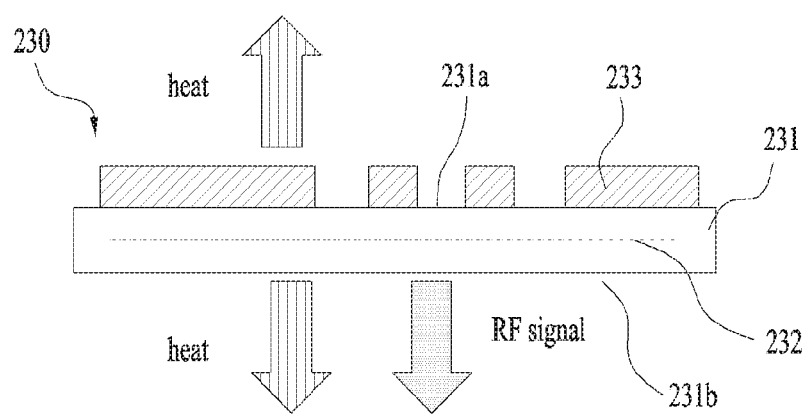

FIGS. 2 and 3 are conceptual views of an antenna module 230 in accordance with the present disclosure. The antenna module 230 may include a plurality of radiators 232; and a wireless IC 233 configured to control the signal radiated via the radiators 232. The radiators 232 may be aligned in one direction as shown in FIG. 2 (a) or in two directions, only to expand the adjustment range of the radiation direction.

Considering the position of the loaded antenna module 230 and the relation between the antenna module 230 and peripheral electronic components which are loaded nearby, the arrangement of the radiators 232 may be selected. In other words, when the antenna module 230 has to be arranged in a long narrow space, such an antenna module 230 as shown in FIG. 2 (a) may be used. When the antenna module 230 requires a little wider beam forming, the type shown in FIG. 2 (b) may be used.

Radiators 232 and a wireless IC 233 may be loaded in an antenna board 231 configured of a plurality of layers in the antenna module 230 in accordance with the present disclosure. The antenna board 231 may be a typical printed circuit board (PCB) or a flexible printed circuit board (FPCB) selectively. The antenna board 231 may include a plurality of insulation layers and the insulation layers forming the radiators 232 may be arranged in the antenna board 231. The radiator 232 may be configured of a thin metal film. If arranged in the outermost insulation layer, the radiators 232 are likely to get damaged during the assembly or distribution process. Accordingly, the radiators 232 may be embedded in the antenna board 231 as shown in FIG. 3.

The wireless IC 233 may be loaded in the antenna board 231 as an IC type or on a surface of the antenna board 231 as an SMT type for simple assembling. The wireless IC 233 may be connected with the radiators 232 through a via-hole which penetrates the insulation layers. The wireless IC 233 may be loaded on one surface (231a, an upper surface in the drawing) of the antenna board 231 and no other electronic components may be loaded on the other surface (231b, a lower surface in the drawing) of the antenna board 231.

To radiate a signal, the radiators 232 may not be interfered or blocked by the electronic components or metal. One surface of the antenna board is arranged toward the inside of the mobile terminal 100 and the other surface has no electronic components loaded thereon.

Figure 4:
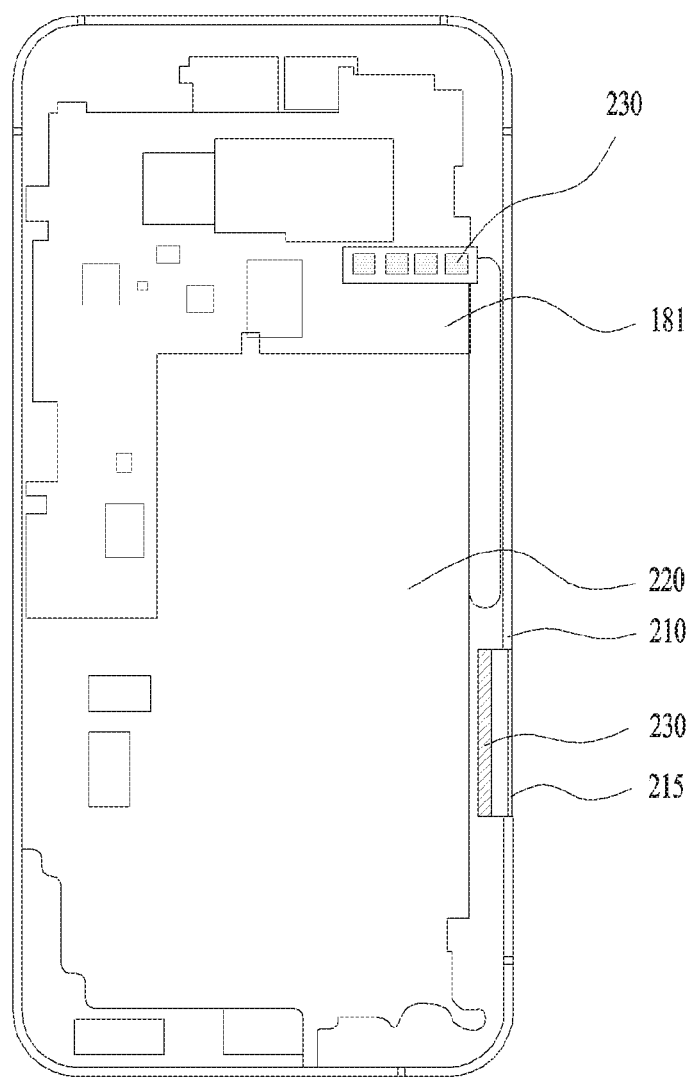
FIG. 4 is a diagram to describe the arrangement of the antenna module.

FIG. 4 is a diagram to describe the arrangement of the antenna module 230 and shows the arrangement of the main board, the middle frame and the antenna module 230, without the rear case 102. The mobile terminal 100 includes the middle frame 220 arranged in a rear surface of the display unit to enhance the strength of the mobile terminal 100. The middle frame 220 may be integrally formed as one body with the side case 210 arranged in a lateral surface of the mobile terminal 100.

The rear case 102 may be coupled to the side case 210, with an overall front circumference contacting with the side case 210, to cover the main board 181 and the battery. The window 151a is coupled to the side case 210, with a rear circumference contacting with the side case 210, to cover the display unit 151 arranged on a front surface of the middle frame 220.

The middle frame 220 may include a metal area having a conductive material and a non-metal area having a non-conductive material. To provide a disposing structure for loading the diverse components or connect the middle frame with the other members, the middle frame 220 may be embodied by double-injection molding the non-metal area to the metal area.

If all area of the side case 210 is formed of the conductive material, an antenna signal cannot be transmitted. To solve the problem, the side case 210 may also include a metal area and a non-metal area.

Considering a radiation direction, the antenna module 230 in accordance with the present disclosure may be arranged in a lateral or rear direction of the mobile terminal 100. The wireless communication performance depends on the location where the user's hand touches the mobile terminal 100 while the user is holding the mobile terminal 100 or the direction in which a resting surface of the mobile terminal while the mobile terminal 100 is rested on the floor, such that the antenna radiators 22 may be arranged in the rear direction or lateral direction, respectively.

Figure 5:
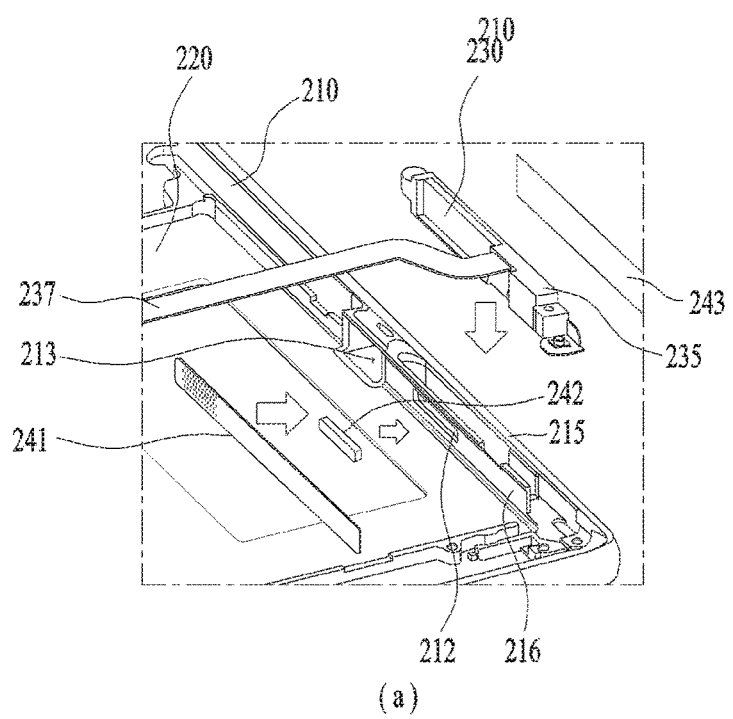
FIG. 5 is a diagram illustrating an antenna module and a heat radiation module in accordance with one embodiment which are provided in the mobile terminal.
Figure 5:
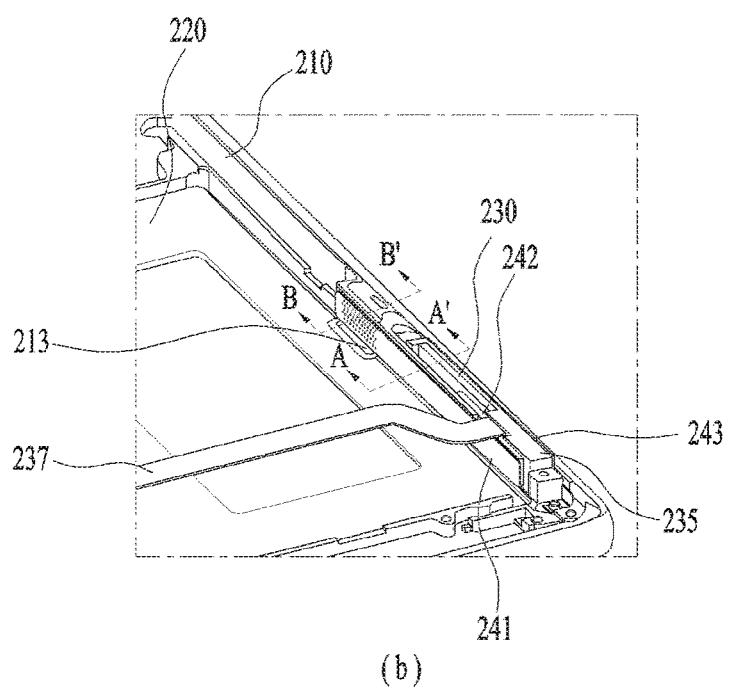
Figure 6:
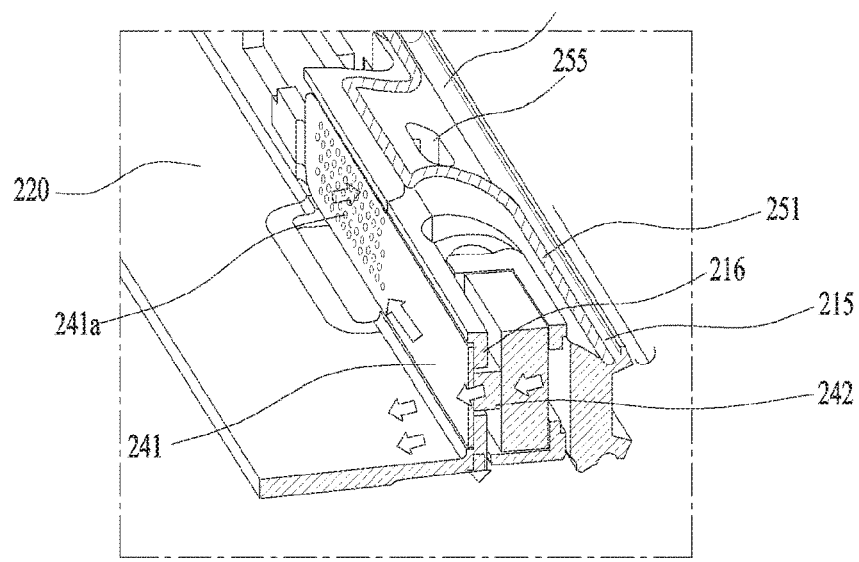
FIG. 6 is a sectional diagram of FIG. 5 (*b*) along A-A and B-B.
Figure 6:
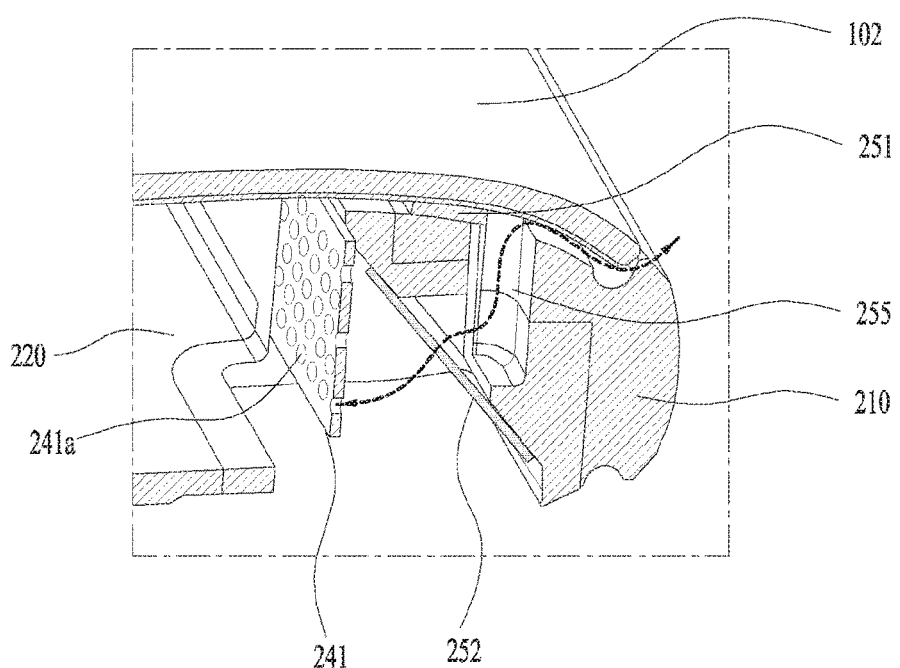

FIG. 5 is a diagram illustrating an antenna module and a heat radiation module in accordance with one embodiment which are provided in the mobile terminal. FIG. 5 (*a*) illustrates a state before the antenna module 230 is coupled and FIG. 5 (*b*) illustrates a state where the antenna module 230 is coupled to the side case 210. FIG. 6 is a sectional diagram of FIG. 5 (*b*) along A-A and B-B.

The embodiment shown in FIGS. 5 and 6 relates to the antenna radiator 232 arranged in the lateral surface of the mobile terminal 100. When the antenna module 230 is arranged in the lateral surface of the mobile terminal 100, there is no sufficient installation space for the antenna module 230 because of the recent trend that the mobile terminal 100 becomes slim and thin.

In this instance, the antenna module 230 having the radiators 232 aligned in line may be used as shown in FIG. 2 (*a*) and one surface of the antenna module 230 having the wireless IC 233 loaded thereon may be directed toward the inside of the mobile terminal 100. When the metal area of the side case 210 is overlapped with the antenna module 230, the radiators 232 radiate signals and the wireless communication performance might deteriorate at this time. Accordingly, the non-metal area 251 may be located in the side case 210 located in an outer area of the portion where the antenna module 230 is loaded.

As shown in FIG. 5 (*a*), the side case 210 may include a loading area for the antenna module 230; an outer exterior area located outside with respect to the antenna module 230; and a partition wall 216 located inside. The antenna module 230 may be inserted between the outer area and the partition wall 216. The outer area may include the non-metal area 251 as mentioned above and the partition wall 216 located inside may include the metal area for the strength. In other words, the antenna module 230 inserted between the non-metal area 251 and the metal area may be coupled to the side case 210. The antenna module 230 may further include an antenna bracket 235 to couple the antenna module 230 to the side case 210.

The side case 210 having the conductive material may be used as the radiator 232 such that the antenna module 230 may be arranged while avoiding the area used as the radiator 232. In this instance, the main board can be far from the antenna module 230 and they are connected via a signal wire 237 of a flexible printed circuit board.

The antenna module 230 including the wireless IC 233 is likely to generate heat. When the heat generated in the wireless IC 233 is directly transmitted to the side case 210, the heat happens to be transmitted to the user's hand and it needs radiating. The heat radiation is divided into two steps. When the heat is concentrated on a specific location, the user might get a burn in holding the mobile terminal 100 and it is necessary to diffuse the heat.

The second step is to radiate the heat outside the mobile terminal and uses a method of transmitting the heat to external air by contacting a high temperature member with the external air. When a heat generating member is located inside, a heat radiation unit configured to transmit the heat to an area contacting with external air by using a predetermined member with a high heat conductivity.

It is difficult for the antenna module 230 coupled to the side case 210 shown in FIG. 5 to directly contact with the heat radiation unit to relieve the heat generation of the electronic components loaded in the main board 181 of the mobile terminal 100, such that an auxiliary heat radiation unit has to be provided.

To prevent the heat generated in the wireless IC 233 from being directly transmitted to the user's hand through the side case 210, a heat diffusion sheet 243 configured to diffuse the heat between the antenna module 230 and the outer area (the non-metal area) of the side case 210 may be further provided. The heat diffusion sheet 243 used in the present embodiment is located toward the other surface of the antenna module 230. Accordingly, it is preferred that the heat diffusion sheet 243 uses a non-metal material not to affect a wireless signal in the direction where the radiators 232 radiate signals.

In this embodiment, the heat generated in the wireless IC 233 of the antenna module 230 may be radiated by using a heat radiation sheet 241 having a high heat conductivity, which is made of copper or aluminum.

The heat radiation sheet 241 provided as the heat radiation unit arranged in the mobile terminal 100 may have one side contacting with the wireless IC 233 and the heat generated in the wireless IC 233 is moved along the heat radiation sheet 241 so as to radiate the heat of the wireless IC 233. At this time, unless the heat radiation sheet 241 directly contacts with the wireless IC 233, a connecting hole 212 may be formed in the partition wall 216 as shown in FIG. 6 (*a*) and a thermal interface material (TIM) 242 (e.g., thermal grease) is inserted in the connecting hole 212 so as to radiate the heat of the wireless IC 233 to the heat radiation sheet 241.

Recently, the gaps between the cases of the mobile terminal 100 having a waterproof structure may be sealed by using an elastic member or a waterproof tape so as to prevent water from penetrating through the gaps. A waterproof member 251 partitions off the space of the mobile terminal 100 into an inner portion and an outer portion such that it can be difficult to radiate the heat generated in the mobile terminal 100 outside.

To solve the problem, the other end of the heat radiation unit may be arranged adjacent to an air vent hole 255. Gas such as air can penetrate the air vent hole 255, while liquid cannot. A waterproof mesh 252 which allows only a gas unit particle to pass through (e.g., Gore-Tex) may cover the air vent hole 255 such that external water cannot pass through the air vent hole 255 (see FIG. 6 (*b*)).

When the volume of the air inside the mobile terminal 100 is changed by temperature change or moving to a place at a high altitude by plane in case air cannot be exchanged between the inner portion and the outer portion in the waterproof structure by sealing the inside of the mobile terminal 100, the mobile terminal 100 is likely to damage or break. To solve the problem, the air vent hole 255 may be formed in one side of the case and partially penetrate air to adjust the air pressure of the inner portion and the air pressure of the outer portion of the mobile terminal 100 to each other.

As shown in FIGS. 5 and 6, the air vent hole 255 may be formed in the side case 210. One side of the air vent hole 255 may be directed toward the inside of the mobile terminal 100 and the other side may be arranged in the contact area between the rear case 102 and the side case 210. In this instance, a waterproof member 251 may be provided in an inner area with respect to the other end of the air vent hole 255, not to shut off the heat transmitted to the other end of the air vent hole 255. When the other end of the air vent hole 255 is covered by the rear case 102, the air vent hole 255 may not be exposed outside to deteriorate the exterior design and the air vent hole 255 may be realized.

The air vent hole 255 may be employed as the passage of the air from the inner portion to the outer portion of the mobile terminal 100. When the other end of the heat radiation sheet 241 is arranged adjacent to the air vent hole 255, the heat which reaches the other end of the heat radiation sheet 241 may be exhausted outside via the air vent hole 255. As shown in FIG. 6 (b), a plurality of hear radiation holes 241a may be formed in the other end of the heat radiation sheet 241 arranged adjacent to the air vent hole 255 such that a contact area with the air moving along the air vent hole 255 may increase to perform the heat exhaustion more efficiently.

Figure 7:
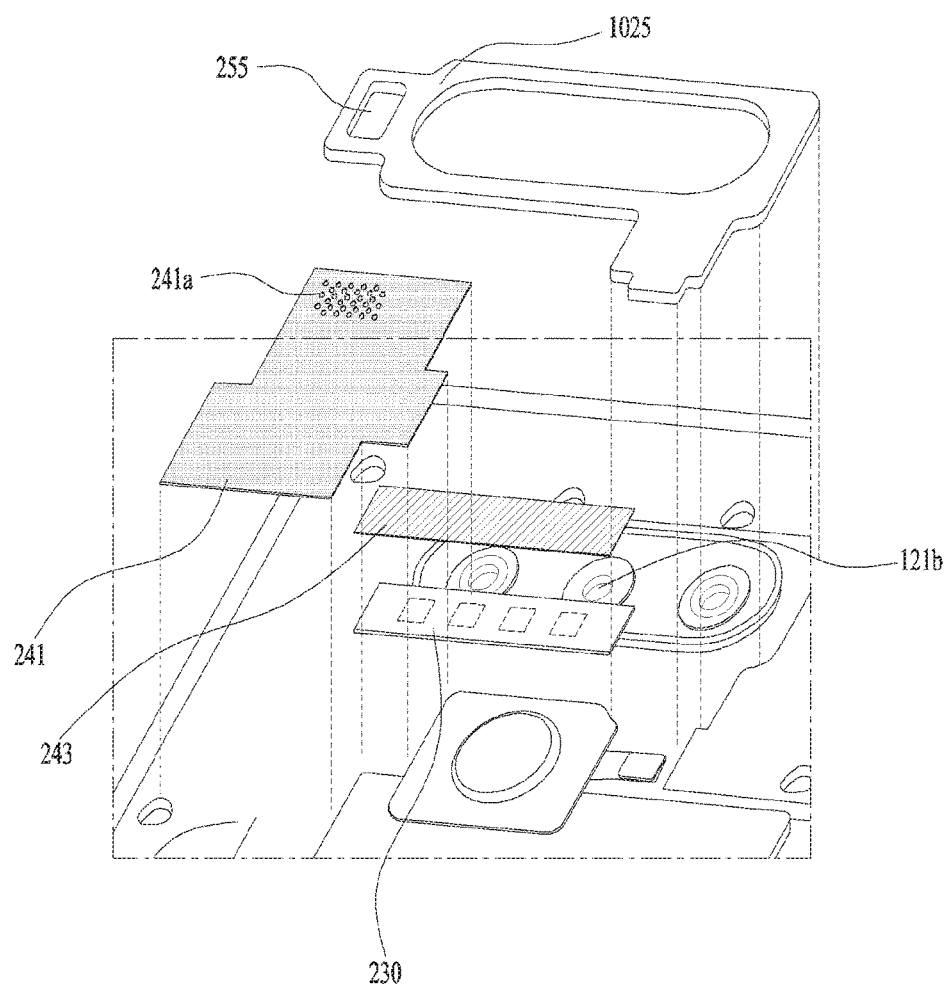
FIGS. 7 and 8 are diagrams an antenna module and a heat radiation module in accordance with another embodiment.
Figure 8:
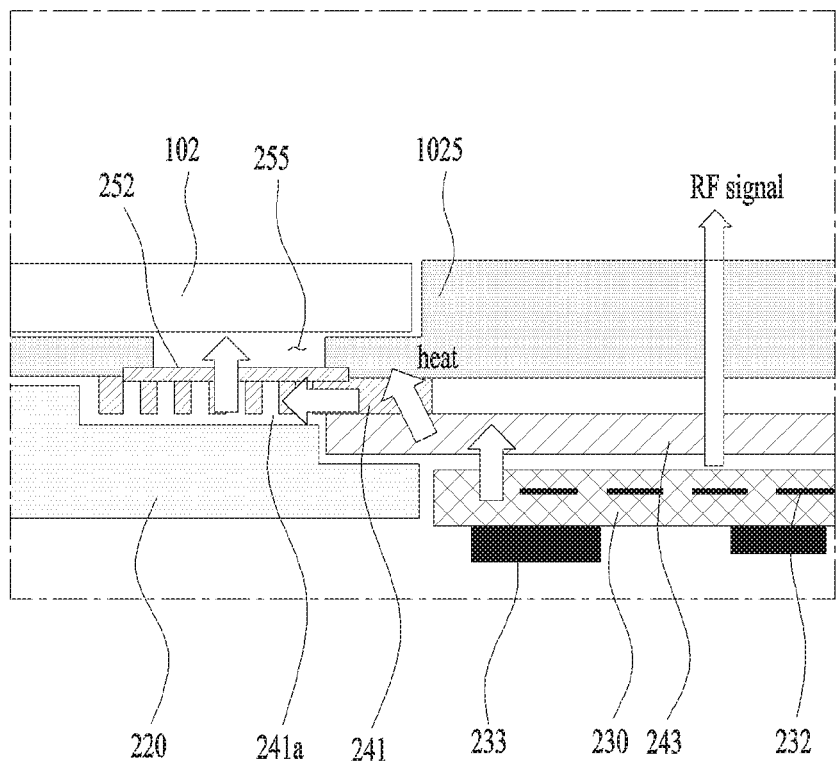

FIGS. 7 and 8 are diagrams an antenna module 230 and a heat radiation module of the mobile terminal 100 in accordance with another embodiment. An air vent hole 255 in accordance with this embodiment may be located in a direction of the rear surface of the mobile terminal 100 and the antenna module 230 may radiate a signal toward the direction of the rear surface.

The air vent hole 255 arranged toward the rear surface of the mobile terminal 100 may be formed in a camera frame 1025 provided to cover the camera 102b arranged the rear surface of the mobile terminal 100. Not to expose the air vent hole 255 outside the mobile terminal 100 directly, the rear case 102 may cover the other end of the air vent hole 255 to realize the air vent hole 255.

the loading space of the antenna module 230 in the structure of the present embodiment is more sufficient than the loading space of the antenna module 230 arranged in the side case 210 mentioned above such that the heat radiation sheet 241 can be arranged in a wide space. Referring to FIG. 8, the antenna module 230 is located in an inner area with respect to the heat radiation unit. Accordingly, when the heat radiation sheet 241 having the metal material (e.g., copper or aluminum) directly contacts with the antenna module 230, the signal radiation performance of the antenna module 230 might be affected.

Accordingly, in this embodiment, the heat diffusion sheet 243 made of a non-metal material may contact with the other surface of the antenna module 230 and the heat transmitted via the heat diffusion sheet 243 may move to the air vent hole 255 along the heat diffusion sheet 241. The heat radiation sheet 241 may not be overlapped with the antenna module 230 directly and a plurality of heat radiation holes 241a may be formed adjacent to the air vent hole 255, like the embodiment mentioned above.

As mentioned above, the mobile terminal 100 in accordance with the present disclosure may radiate the heat generated in the antenna module 230 for the 5G wireless communication under the waterproof structure efficiently.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A mobile terminal comprising:
    a terminal body comprising a plurality of cases forming an external appearance of the mobile terminal and defining an inner space within the mobile terminal;
    a waterproof member configured to prevent liquid from entering the inner space of the mobile terminal between at least two of the plurality of cases;
    an air vent hole configured to allow air to pass between the inner space and an exterior of the mobile terminal to allow pressure to equalize between the inner space and the exterior of the mobile terminal;
    a waterproof mesh disposed at the air vent hole and configured to allow air but not liquid to pass through the air vent hole;
    an antenna module provided in the plurality of cases and comprising an antenna radiator and a wireless integrated circuit; and
    a heat radiation unit having a first end adjacent to the antenna module and a second end adjacent to the air vent hole to allow heat from the antenna module to escape via the air vent hole.

2. The mobile terminal of claim 1, wherein the heat radiation unit comprises a plurality of heat radiation holes disposed adjacent to the air vent hole.

3. The mobile terminal of claim 1, wherein the heat radiation unit comprises copper or aluminum.

4. The mobile terminal of claim 1, wherein:
    the plurality of cases comprises a side case disposed at a lateral side of the mobile terminal and comprising a metal area and a non-metal area; and
    the antenna module is disposed adjacent to the non-metal area of the side case.

5. The mobile terminal of claim 4, wherein:
    the plurality of cases further comprises a rear case;
    the waterproof member is disposed between the rear case and the side case; and
    the air vent hole extends between an interior of the mobile terminal to a region outside the waterproof member, wherein a first opening of the air vent hole is covered by the rear case.

6. The mobile terminal of claim 5, wherein:
    the side case further comprises a partition wall formed with a connecting hole therethrough, wherein the antenna module is disposed at an outer side of the partition wall adjacent to the connecting hole; and
    the heat radiation unit comprises:
    a thermal interface material (TIM) member disposed at the connecting hole and configured to contact the antenna module; and
    a heat radiation sheet having a first end in contact with the thermal interface material member and a second end adjacent to a second opening of the air vent hole.

7. The mobile terminal of claim 4, further comprising a heat diffusion sheet disposed between the non-metal area and the antenna module.

8. The mobile terminal of claim 1, further comprising an antenna bracket coupled to a side case of the plurality of cases and configured to accommodate the antenna module.

9. The mobile terminal of claim 1, wherein the antenna module comprises:
    an antenna board comprising a plurality of layers;
    a wireless integrated circuit disposed at the antenna board; and
    an antenna radiator configured to radiate a signal.

10. The mobile terminal of claim 9, wherein the antenna module is disposed such that a first side of the antenna board faces toward the interior of the mobile terminal and a second side of the antenna board opposite the first side faces toward the exterior of the mobile terminal.

11. The mobile terminal of claim 1, further comprising a camera comprising a lens disposed at a rear side of the terminal body and a camera frame disposed around the lens and forming a portion of the exterior appearance the mobile terminal, wherein the antenna module is disposed adjacent to the camera, wherein the air vent hole is an opening formed at the camera frame, and a rear case of the plurality of cases covers a portion of the camera frame and is configured to cover the air vent hole.

12. The mobile terminal of claim 1, wherein the antenna radiator comprises a plurality of antenna radiators aligned at preset intervals of 1 cm or less.

* * * * *